(12) United States Patent
Troiani

(10) Patent No.: US 10,270,217 B2
(45) Date of Patent: Apr. 23, 2019

(54) DE-EMPHASIS WITH SEPARATE EDGE CONTROL

(71) Applicant: MACOM Technology Solutions Holdings, Inc., Lowell, MA (US)

(72) Inventor: Matteo Troiani, Irvine, CA (US)

(73) Assignee: MACOM Technology Solutions Holdings, Inc., Lowell, MA (US)

(\*) Notice: Subject to any disclaimer, the term of this patent is extended or adjusted under 35 U.S.C. 154(b) by 0 days.

(21) Appl. No.: 15/687,392

(22) Filed: Aug. 25, 2017

(65) Prior Publication Data

US 2018/0062343 A1 Mar. 1, 2018

Related U.S. Application Data

(60) Provisional application No. 62/379,694, filed on Aug. 25, 2016.

(51) Int. Cl.
*H01S 3/10* (2006.01)
*H04B 10/50* (2013.01)
*H04B 10/58* (2013.01)
*H01S 5/026* (2006.01)

(52) U.S. Cl.
CPC ........ *H01S 3/10015* (2013.01); *H01S 5/0261* (2013.01); *H04B 10/504* (2013.01); *H04B 10/58* (2013.01); *H03C 2200/0016* (2013.01)

(58) Field of Classification Search
CPC ... H01S 3/10015; H01S 5/0261; H04B 10/58; H04B 10/504; H03C 2200/0016
See application file for complete search history.

(56) References Cited

U.S. PATENT DOCUMENTS

| | | | | |
|---|---|---|---|---|
| 3,794,921 A | * | 2/1974 | Unkauf | H04B 7/005 327/100 |
| 2004/0140832 A1 | * | 7/2004 | Shiah | H03K 5/04 327/170 |
| 2012/0045217 A1 | * | 2/2012 | Tsunoda | H03K 5/1565 398/182 |
| 2015/0139257 A1 | * | 5/2015 | Raj | H01S 5/068 372/21 |

\* cited by examiner

*Primary Examiner* — Yuanda Zhang
(74) *Attorney, Agent, or Firm* — Weide & Miller, Ltd.

(57) ABSTRACT

A driver system with emphasis or de-emphasis control of optic signal generator comprising an input configured to receive an input signal that is to be transmitted as an optic signal. Also part of this system is a rising edge delay creating a first delay signal relative to the input signal and a falling edge delay creating a second delay signal relative to the input signal. A multiplexer receives the first delay signal and the second delay signal and selectively outputs either the first delay signal and the second delay signal to an amplifier. A first amplifier amplifies the input signal to create an amplified input and a second amplifier amplifies the multiplexer output signal to create a de-emphasis signal. A summing junction subtracts the de-emphasis signal from the amplified input to create a driver output signal. The rising and falling edge delays may each comprise two more delays.

18 Claims, 4 Drawing Sheets

DE-EMPHASIS WITH SEPARATE EDGE CONTROL

1. PRIORITY CLAIM

This applicant claims priority to and the benefit of U.S. provisional patent application No. 62/379,694 filed on Aug. 25, 2017 and entitled De-Emphasis With Separate Edge Control.

2. FIELD OF THE INVENTION

This innovation relates to drivers for optic signal generators and in particular to a method and apparatus for compensating an input signal with emphasis, de-emphasis, or both.

3. RELATED ART

A major challenge for DML (direct modulated laser) drivers is the non-linear behavior of the laser. In response to an input signal the laser outputs a pulse or a signal rising from logic level zero to logic level one. This create an optical signal with a rising edge and a falling edge. For example, the optical falling edge is much slower than the rising edge, and moreover the rising edge usually shows ringing behavior due to relaxation oscillation. Such non-linear behavior degrades eye quality, eye margin and therefore the overall transmission quality. This results in limited data rates or increased bit error rates. This innovation presents a method and a circuit that solve this technical problem.

De-emphasis is a well-known technique used in electrical signals for high speed transmission over wireline to compensate for channel loss or any other sources/causes that limit the bandwidth. De-emphasis provides additional power at high frequency to the transmitted signal, which in time domain, is equivalent to add overshoot/peaking to signal edges. However, classic de-emphasis is not well suited for driving an optical communication laser because it exacerbates the unwanted ringing behavior of the rising edge that creates jitter and eye margin degradation.

SUMMARY

To overcome the drawbacks of the prior art and provide additional benefit a driver system with emphasis or de-emphasis for an optic laser is disclosed. In this example embodiment, an input is configured to receive an input signal such that the input signal is to be transmitted as an optic signal. Also part of this embodiment is a rising edge delay configured to create a first delay signal relative to the input signal and a falling edge delay configured to create a second delay signal relative to the input signal. A multiplexer is configured to receive the first delay signal and the second delay signal and selectively output either the first delay signal and the second delay signal to an amplifier. A first amplifier is configured to amplify the input signal to create an amplified input while a second amplifier is configured to amplify the multiplexer output signal to create a de-emphasis signal. A summing junction configured to subtract the de-emphasis signal from the amplified input to create a driver output signal.

In one configuration, the rising edge delay comprises two or more delays. The falling edge delay may comprise two or more delays. The system may further comprise additional delay elements and the multiplexer is further configured to receive additional delay signals from the additional delays.

In one variation, the system includes a third amplifier configured to amplify the amplified input to magnitude match the amplified input signal to the de-emphasis signal. It is also contemplated that the rising edge delay and the falling edge delay each comprise one or more delays arranged in series and a multiplexer configured to receive as multiplexer inputs. The output from each delay in series, and a control signal and responsive to the control signal, output one of the multiplexer inputs.

In one embodiment, the driver output signal includes both emphasis and de-emphasis. The driver output signal may include both falling edge modification and rising edge modification.

Also disclosed is a method for modifying an input signal with emphasis or de-emphasis that includes receiving an input signal, presenting the input signal to delay, delaying a rising edge of the input signal, a falling edge of the input signal, or both, to create a delayed signal, and combining the delayed signal and the input signal to create a output signal.

In one variation, the method may include amplifying the input signal prior to presenting the input signal to the delay. In one embodiment, this method may further comprise presenting the input signal to a second delay to create a second delayed signal, presenting the delayed signal and the second delayed signal to a switch, outputting either the delayed signal or the second delayed signal from the switch as a switch output signal, and combining the input signal and switch output signal to generate a output signal having emphasis, de-emphasis, or both.

The switch may be a multiplexer. In one variation, the method also includes amplifying any combination of the input signal, the switch output signal, or an amplified input signal. The step of providing the input signal to a delay may include providing the input signal to a rising edge delay and a falling edge delay such that each of the rising edge delay and a falling edge delay each generate a delayed version of the input signal, and each delayed version of the input signal is provided to the switch. In one variation, either or both of the rising edge delay and falling edge delay comprises one or more delays which provide an input to a multiplexer having an output and the multiplexer output is provided to the switch.

Also disclosed herein is a system for selectively providing emphasis, de-emphasis, or both to an input signal, such as an input signal used to drive an optic signal generator. In one embodiment, the system comprises an input configured to receive an input signal that provides the input signal directly to or with amplification to a first delay line path and a second delay line path. The first delay line path includes a first delay line having one or more delays configured to receive the input signal and establish one or more delayed versions of the input signal. Also part of the first delay line path is a first multiplexer having two or more inputs, a control signal input, and an output. The first multiplexer is configured to receive two or more of the delayed versions of the input signal and, responsive to a first control signal, output one of the two or more delayed versions of the input signal as a first multiplexer output. The second delay line path includes a second delay line including one or more delays configured to receive the input signal and establish one or more delayed versions of the input signal. Also part of the second delay line path is a second multiplexer having two or more inputs, a control signal input and an output, such that the second multiplexer configured to receive two or more of the delayed versions of the input signal and, responsive to a second control signal, output one of the two or more delayed versions of the input signal as a second multiplexer output. A third multiplexer is configured to receive the first multiplexer output and the second multiplexer output, and responsive to a third control signal, output either or both of the first multiplexer output and the second multiplexer output. A summing junction is configured to receive and combine the input signal, and either or both of the first multiplexer output and the second multiplexer output to create an output signal having emphasis, de-emphasis, or both.

The multiplexer may comprise a switch, multiplexer, logic, or any other device capable of and configured to selectively output, responsive to a control signal, one or more signal selected from two or more inputs. In one embodiment, the first delay line path introduces a rising edge delay to the input signal and the second delay line path introduces a falling edge delay to the input signal. In one embodiment, this system further comprises one or more amplifiers configured to amplify the input signal, a multiplexer output, or an output signal. The control signal of the first delay line path may control the amount of rising edge delay introduced to the output signal and the control signal of the second delay line path controls the amount of falling edge delay introduced to the output signal.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

In general, this innovation adds high frequency energy to one edge only, in particular the falling edge because it is the slowest, or, in other embodiments, it allows de-emphasis control separately for each edge, providing emphasis or de-emphasis for either the rising edge, the falling edge, or both, using different or the same de-emphasis or emphasis values and timing. This compensates for signal distortion that occurs during transmission of the electrical signal and optic signal through the electro-optical channel (laser, fiber optic cable, and photodiode), thereby improving signal quality upon receipt at a remote receiver.

Figure 1:
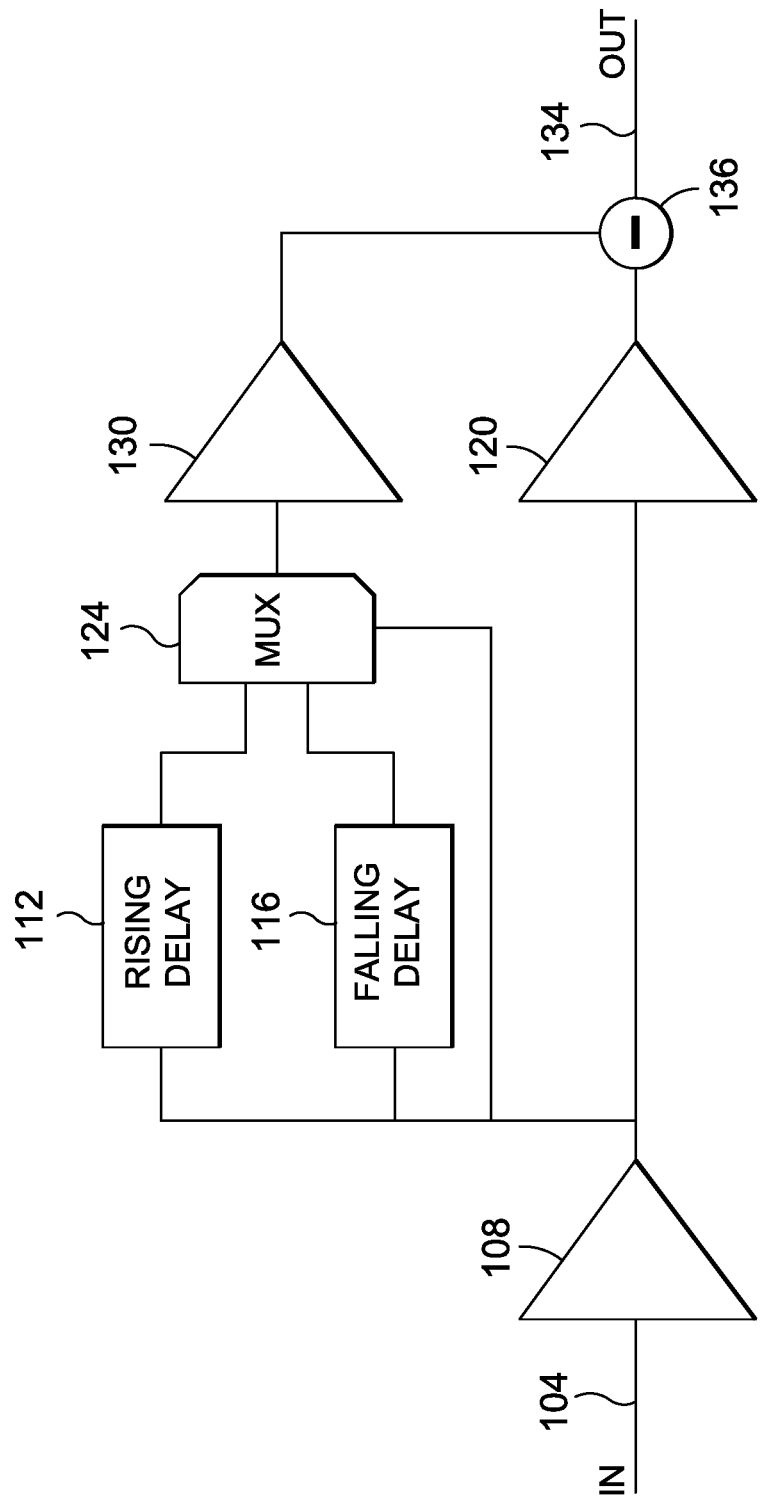
FIG. 1 illustrates an exemplary input/output and driver system for an optical driver according to the present innovation.

FIG. 1 illustrates an exemplary input/output and driver system for an optical driver according to the present innovation. An input 104 connects to a first amplifier or buffer 108, or any other device capable of performing as an amplifier or buffer. Other embodiments may omit the first amplifier or buffer 108. The amplifier 108, or any other amplifier designed herein, may be any type amplifier configured to adjust (upward or downward) the magnitude, phase, or any other element of a signal. As discussed herein, the amplifiers adjust the magnitude, phase, or both of signals to maintain signal levels when signals are combined (such as through addition or subtraction). The amplifiers described herein may also be configured as buffers. The amplifiers may be single or multiple stage amplifiers and will have associated biasing and optional feedback as needed.

Figure 2:
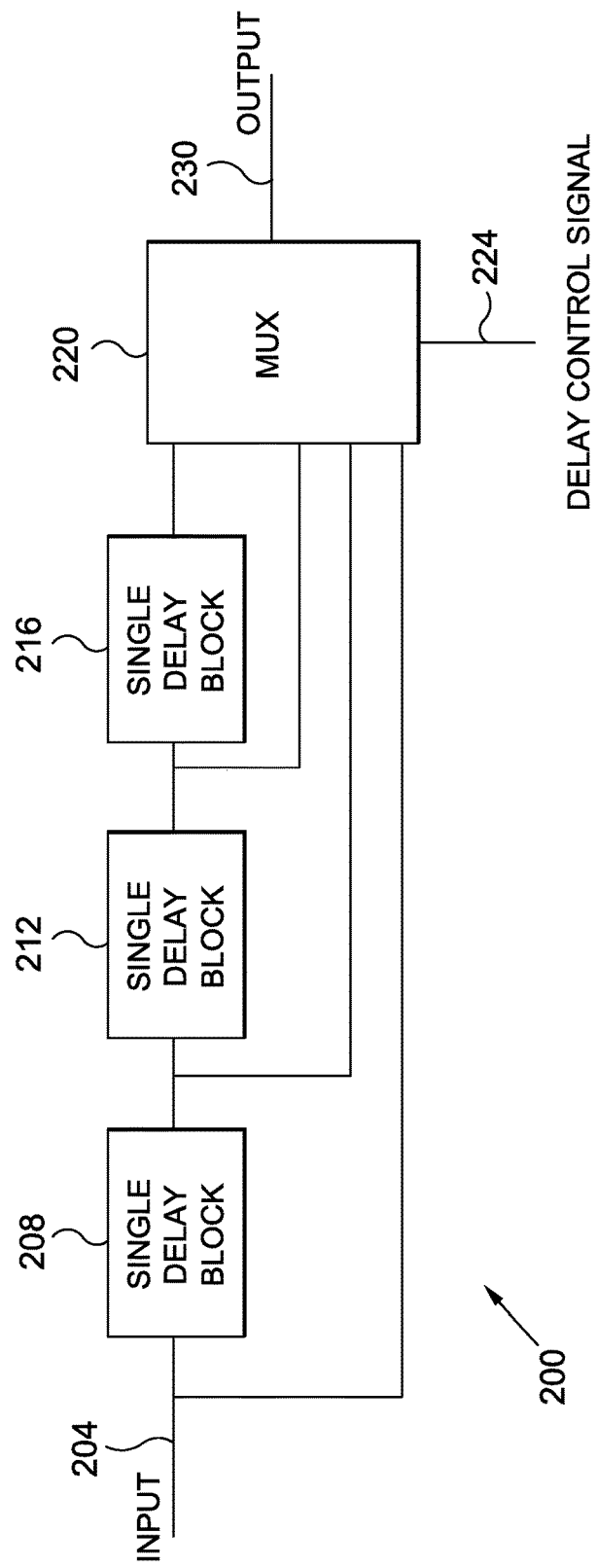
FIG. 2 illustrates an exemplary delay module, such as may be implemented in rising edge delay module or falling edge delay modules shown in FIG. 1.

The input signal presented to the input 104 is the signal to be transmitted by the last stage of the laser driver (that can consist of one or more gain stages or buffers). The output of the first amplifier or buffer 108 connects to a rising edge delay module 112, a falling edge delay module 116, and a second amplifier or buffer 120. Each delay module 112, 116 may comprise one or more delays or any other element that serves the function of a delay to the signal and then output the signal or a modified version of the signal. The delays are configured to delay either rising edge or falling edge of the input signal to created delayed version of the input signal. FIG. 2 provides a more detailed view of an exemplary delay module 112, 116. The second amplifier or buffer 120 may comprise any type amplifier or buffer or other equivalent element that is configured to match the signal magnitude, phase, or other signal aspect with the output of the other signal paths.

The output of the rising edge delay module 112 and the falling edge delay module 116 connect to a multiplexer 124. The multiplexer (MUX) 124 also receives, as a control signal, the output of the first amplifier or buffer 108. The rising edge delay module 112 establishes a delay in the signal and provides the delayed signal to the multiplexer 124. The multiplexer is defined broadly herein as any device capable of receiving one or more inputs and, responsive to a control signal or other event or control mechanism, selectively outputting one or more of the inputs as a multiplexer output signal. The multiplexer 124 may comprise any type multiplexer, switch, logic, data selector, encoder, or any other device capable of performing as described herein. Any number of delays may be provided to allowed the multiplexer 124 to select an output signal with any amount of delay, subject to the number of delays in the system.

The falling edge delay module 116 establishes a delay amount in the signal and provides the delayed signal to the multiplexer 124. As shown in greater detail in FIG. 2, a delay control signal may be provided to either or both of the delay modules 112, 116 to control the amount of delay introduced by the delay 112, 116 in each path and it is contemplated that each delay path 112, 116 may introduce different amounts of delay responsive to the control signal. In this embodiment, the output of each delay cell is the replica of its input signal delayed by a delay amount selected by its delay control signal. The delay control signal presented to the rising delay path and falling delay path may be fixed, or vary based on an algorithm or look up table, or set by a user at the time of manufacture or during operation.

The MUX 124 selects which of the inputs to the MUX (either from the rising edge delay 112 or the falling edge delay 116 is output from the MUX 124 based on the value of its select input. Thus, the MUX may select rising edge delay (first delayed signal) or falling edge delay (second delayed signal) based on the control signal. The multiplexer control signal is the is the output of the amplifier 108. In other embodiments, the control signal to the multiplexer 124 does not connect to the output of the amplifier 108, but instead the control signal is received from another source, such as a controller, DSP, processor, or control logic. The output signal of the MUX 124 (that is the de-emphasis signal or emphasis signal) is presented to a driver or buffer 130, which may the same as or different from the amplifier or buffers 108, 120. The output of the driver or buffer 130 is combined, such as through subtraction, from the output of the second amplifier or buffer 120 to form the final output signal on the output 134, which is subsequently delivered to a driver or used to directly drive a optic signal generator 150, such as a laser.

The output signal of the MUX 124 can be amplified by an amplifier 130 (fixed gain or variable gain, or signal attenuation) before the subtraction operation. In one embodiment an amplifier is placed after one, or both of the rising edge delay module 112 or the falling edge delay module 116 to independently adjust the magnitude of each output. In such an embodiment, an output of the rising edge delay 112 would feed into an amplifier. The amplifier 130 may not be included in such an embodiment. The signal coming out of the last stage 120, 130 of the laser driver is the output signal on the output node 134 and is used to drive the laser or for subsequent downstream processing.

FIG. 2 illustrates an exemplary delay module, such as may be implemented in rising edge delay module 112 or falling edge delay modules 116 shown in FIG. 1. As shown, an input 204 connects to a first delay 208 and a multiplexer 220 to provide a first input as shown. As related to FIG. 1, the input 204 would receive the output of the amplifier 108. The output of the first delay 208 feeds into a second delay 212 and a second input to the multiplexer 220. The output of the second delay 212 feeds into a third delay 216 and third input to the multiplexer 220. The output of the third delay 216 feeds into the multiplexer 220A as a fourth input. The delay 200, having multiple single block delays, can be implemented as cascading single delay blocks, each one of those can include an inductor-capacitor low pass filter followed by a buffer stage. The delay control signal provided on control input 224 (can be a digital code or analog signal, or any other control mechanism) selects which delay block 208, 212, 216 output, i.e. the multiplexer inputs, is selected as the output signal from the MUX 220 and thus presented on output 230.

In operation, the signal on input 204 is provided to the first delay 208 and the multiplexer 220. The input signal to the delay propagates through the delay lines 208, 212, 216 and one or more delayed signals are consecutively provided to the multiplexer 220 as shown as inputs. The multiplexer control signal input 224 provides the control signal to the multiplexer which determines which multiplexer input to provide on output 230. The multiplexer 220 may be configured to combine one or more delayed signals received as inputs and thus output one or more of the inputs.

In case of NRZ modulation, the optimum configuration for a DML driver is that one delay cell has a delay smaller (or even no delay) than the other delay and MUX selects the first one (small or no delay) when the driver is transmitting a "1", but selects the second delay amount (large delay) when the driver is transmitting a "0". This allows the system to add more high frequency energy to the falling edge as compared to the amount of additional energy or signal magnitude provided to the rising edge.

Figure 3:
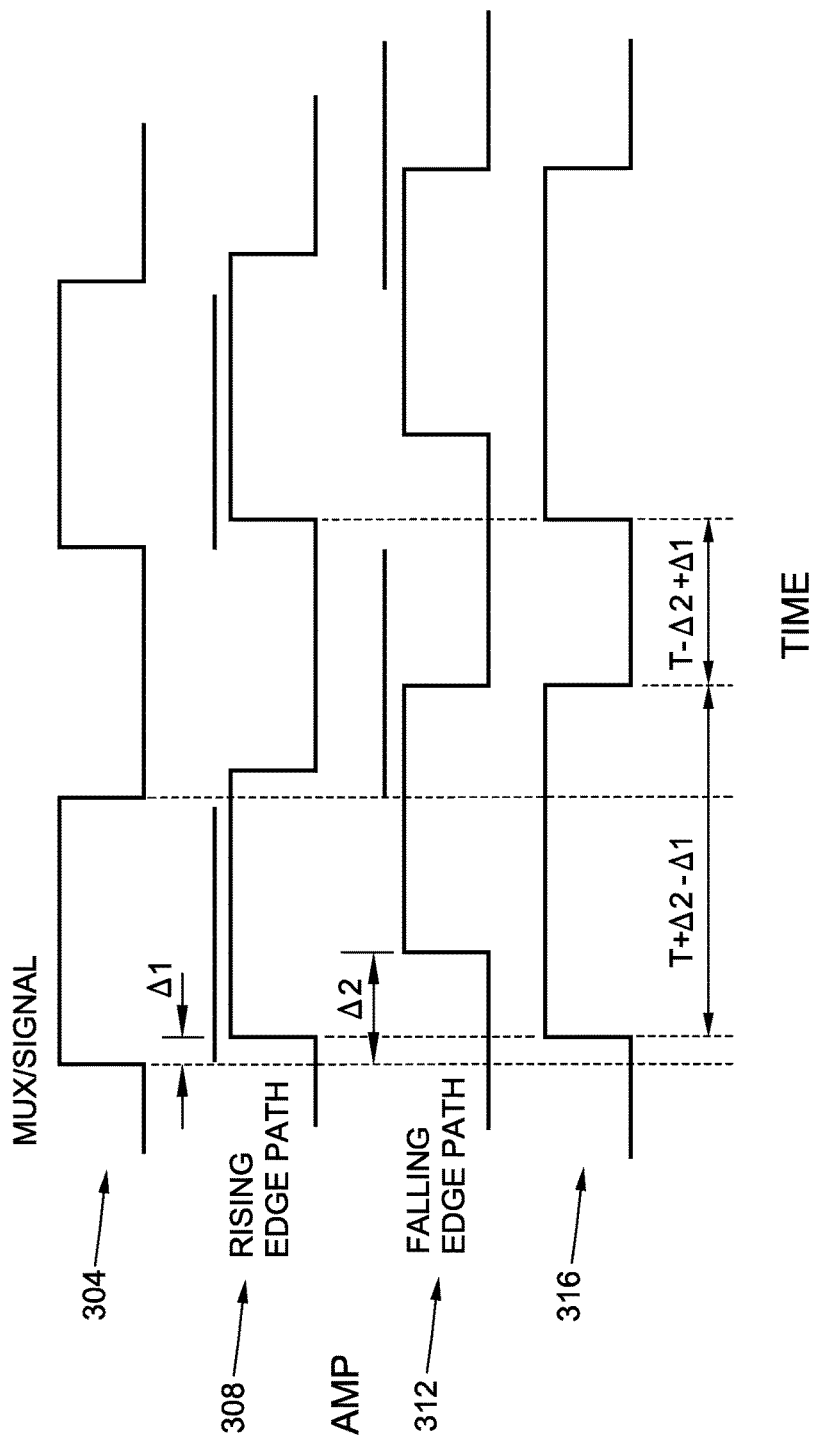
FIG. 3 illustrates exemplary signals plots of a first delay amount provided to the rising edge and a second delay amount provided to the falling edge.

FIG. 3 illustrates exemplary signal plots of a first delay amount provided to the rising edge and a second delay amount provided to the falling edge of an exemplary signal. Time is shown on the horizontal axis 380 while signal amplitude is shown on the vertical axis 384. Signal plot 304 is the input signal presented to the delays 112, 116. As can be seen, it is time varying and includes a riding edge 320 and a falling edge 324. The signal plot 308 is the output of the rising edge delay module 112. As can be seen, the rising edge 326 of signal 308 and the falling edge 328 of signal 308 are delayed by an amount $\Delta 1$.

The signal plot 312 is the output of the falling edge delay module 116. Signal 312 has a rising edge 330 delayed by an amount $\Delta 2$ as compared to input signal 304. Likewise, the falling edge 332 is delayed by an amount $\Delta 2$ as compared to input signal 304. As a result, the multiplexer 124 of FIG. 1 receives input signals 304, 308, and 312.

Signal plot 316 is the output of the multiplexer 124 which is selected based on the control signal provided to the multiplexer. The signal plot 316 is the de-emphasis signal to be applied to the input in the subtractor 136. In plot 308 the $\Delta 1$ is the rising edge delay applied to the input signal to the rising edge delay module. In plot 312 $\Delta 2$ is the falling edge delay that is applied to the input signal to the rising edge delay module 116. The resulting de-emphasis signal in signal plot 316 is the output from the MUX 124 created due to the multiplexer control signal. The multiplexer control signal, when high, causes the multiplexer 124 to output the rising edge delay signal. When the multiplexer control signal, is low, the multiplexer 124 outputs the falling edge delay signal. This establishes as the output from the multiplexer 124 as the signal 316. As can be seen in signal 316, the rising edge is delayed by an amount $\Delta 1$ as compared to input signal 304 while the falling edge is delayed by an amount $\Delta 2$ as compared to input signal 304. The rising edge may be defined as $T+\Delta 2-\Delta 1$ where T is time and the falling edge defined as is $T-\Delta 2+\Delta 1$. This may be referred to as post-tap de-emphasis with separate control of rising and falling overshoot. It can be implemented with a delay and DCD (duty cycle distortion).

Signal 316 has advantages over signal 304 when driving an optic signal generator or when provided as an input to a driver for an optic signal generator, such as a laser, because it improves the overall quality of the received optic signal by de-emphasising one or more aspects of the signal prior to transmission.

Figure 4:
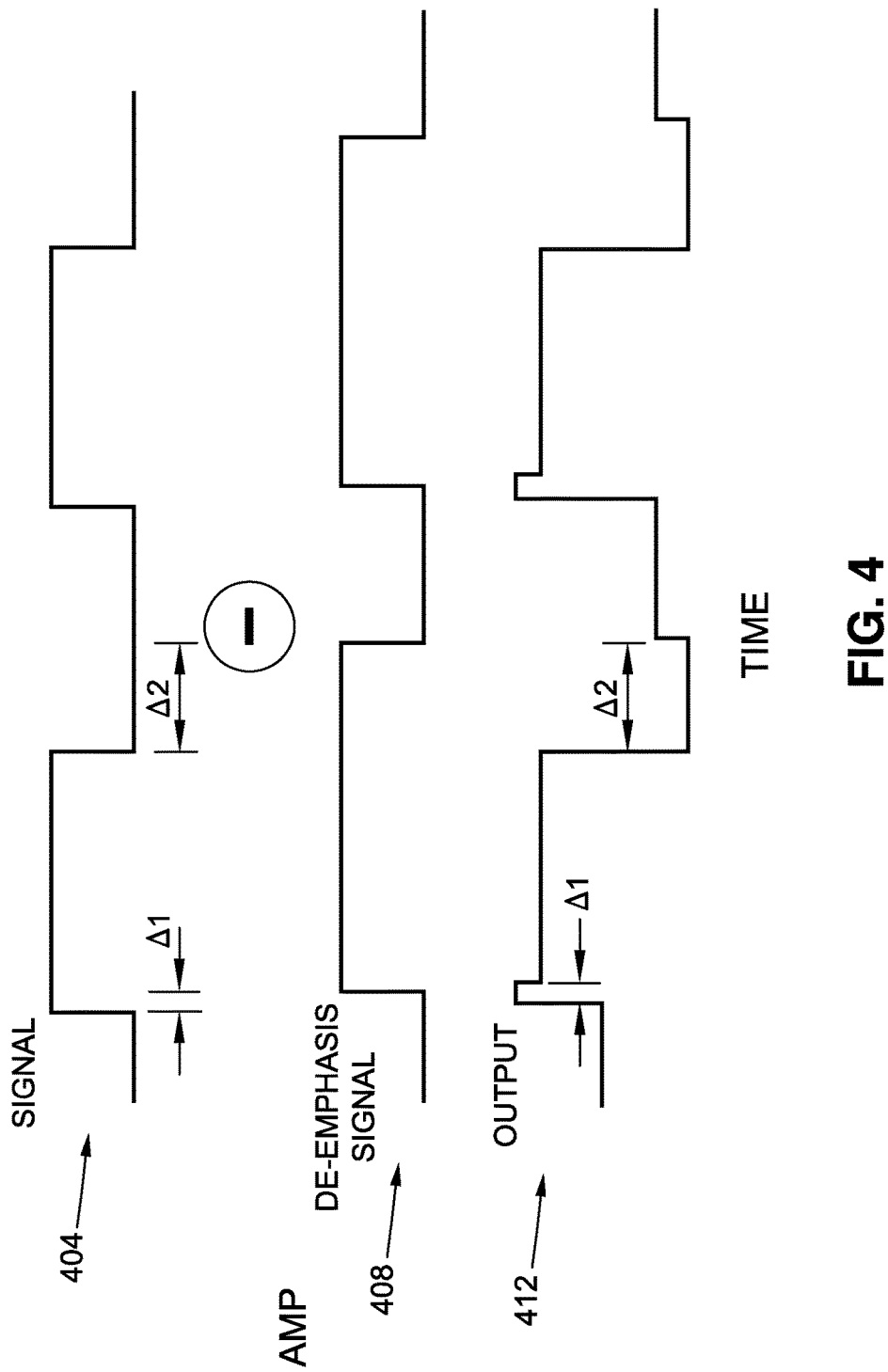
FIG. 4 illustrates a signal plot of the of the input signal, the de-emphasis signal, and the resulting output signal.

FIG. 4 illustrates a signal plot of the input signal 404, the de-emphasis signal 408, and the resulting output signal 412. Time is on the horizontal axis 480 while amplitude of the signal is on the vertical axis 484. The first plot 404 is the input signal, such as the amplified signal at the output of the second amplifier or buffer 120 as shown in FIG. 1. Thus, 404 may be considered an amplified or non-amplified of the input signal on input 104.

The second plot 408 is the de-emphasis signal, which is also shown in plot 316 of FIG. 3. The delays $\Delta 1$ and $\Delta 2$ are the rising edge delay and the falling edge delay as applied to the input signal on input 104. Signal 408 is subtracted from signal 404 resulting in the third signal plot 412. The third signal plot 412 has a small amount of delay at the rising edge and a larger amount of delay at the falling edge for NRZ modulation.

The figures and text describe numerous different embodiments and features. It is contemplated that these different embodiments and figures may be enabled alone or combined any different arrangement to perform as described herein. Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A driver system with emphasis or de-emphasis for an optic laser comprising:
    an input configured to receive an input signal, the input signal to be transmitted as an optic signal;
    a rising edge delay configured to create a first delay signal relative to the input signal;
    a falling edge delay configured to create a second delay signal relative to the input signal;
    a multiplexer configured to receive the first delay signal and the second delay signal and selectively output either the first delay signal and the second delay signal to an amplifier;
    a first amplifier configured to amplify the input signal to create an amplified input;
    a second amplifier configured to amplify the multiplexer output signal to create a de-emphasis signal; and
    a summing junction configured to subtract the de-emphasis signal from the amplified input to create a driver output signal.

2. The system of claim 1 wherein the rising edge delay comprises two or more delays.

3. The system of claim 1 wherein the falling edge delay comprises two or more delays.

4. The system of claim 1 further comprising additional delay elements and the multiplexer is further configured to receive additional delay signals from the additional delays.

5. The system of claim 1 further comprising a third amplifier configured to amplify the amplified input to magnitude match the amplified input signal to the de-emphasis signal.

6. The system of claim 1 wherein the rising edge delay and the falling edge delay each comprise one or more delays arranged in series and a delay associated multiplexer, configured to receive, as delay associated multiplexer inputs, the output from each delay in series, and a control signal and responsive to the control signal, output one of the delay associated multiplexer inputs.

7. The system of claim 1 wherein the driver output signal includes both emphasis and de-emphasis.

8. The system of claim 1 wherein the driver output signal includes both falling edge modification and rising edge modification.

9. A method for modifying an input signal with emphasis or de-emphasis, the method comprising:
    receiving an input signal;
    presenting the input signal to a rising edge delay, the rising edge delay comprising one or more delays;
    delaying a rising edge of the input signal to generate a one or more rising edge delay signals;
    presenting the input signal to a falling edge delay, the falling edge delay comprising one or more delays;
    delaying a falling edge of the input signal to generate a one or more falling edge delayed signals;
    presenting one or more rising edge delay signals and one or more falling edge delay signals to a switch;
    outputting from the switch a delayed signal comprising either one or more rising edge delay signals or one or more falling edge delay signals; and
    combining the delayed signal and the input signal to create an output signal.

10. The method of claim 9 further comprising amplifying the input signal prior to presenting the input signal to the delay.

11. The method of claim 9 further comprising:
    presenting the input signal to a second delay to create a second delayed signal;
    presenting the delayed signal and the second delayed signal to a switch;
    outputting either the delayed signal or the second delayed signal from the switch as a switch output signal;
    combining the input signal and switch output signal to generate an output signal having emphasis, de-emphasis, or both.

12. The method of claim 11 further wherein the switch is a multiplexer.

13. The method of claim 11 further comprising amplifying any combination of the input signal, the switch output signal, or an amplified input signal.

14. A system for selectively providing emphasis, de-emphasis, or both of an input signal, the input signal used to drive an optic signal generator, the system comprising:
    an input configured to receive an input signal;
    a first delay line path including:
        a first delay line comprising one or more delays configured to receive the input signal and establish one or more delayed versions of the input signal;
        a first multiplexer having two or more inputs, a control signal input, and an output, the first multiplexer configured to receive two or more of the delayed versions of the input signal and, responsive to a first control signal, output one of the two or more delayed versions of the input signal as a first multiplexer output;
    a second delay line path including:
        a second delay line comprising one or more delays configured to receive the input signal and establish one or more delayed versions of the input signal;
        a second multiplexer having two or more inputs, a control signal input, and an output, the second multiplexer configured to receive two or more of the delayed versions of the input signal and, responsive to a second control signal, output one of the two or more delayed versions of the input signal as a second multiplexer output;
    a third multiplexer configured to receive the first multiplexer output and the second multiplexer output, and responsive to a third control signal, output either or both of the first multiplexer output and the second multiplexer output;
    a summing junction configured to receive and combine the input signal, and either or both of the first multiplexer output and the second multiplexer output to create an output signal having emphasis, de-emphasis, or both.

15. The system of claim 14 wherein one or more of the multiplexers comprise a switch.

16. The system of claim 14 wherein the first delay line path introduces a rising edge delay to the input signal and the second delay line path introduces a falling edge delay to the input signal.

17. The system of claim 14 further comprising one or more amplifiers configured to amplify the input signal, a multiplexer output, or an output signal.

18. The system of claim 14 wherein the control signal of the first delay line path controls the amount of rising edge delay introduced to the output signal and the control signal of the second delay line path controls the amount of falling edge delay introduced to the output signal.

* * * * *